(12) United States Patent
Anada et al.

(10) Patent No.: US 9,252,040 B2
(45) Date of Patent: Feb. 2, 2016

(54) ELECTROSTATIC CHUCK

(71) Applicant: TOTO LTD., Kitakyushu-Shi, Fukuoka (JP)

(72) Inventors: Kazuki Anada, Fukuoka-Ken (JP); Takuma Wada, Fukuoka-Ken (JP)

(73) Assignee: Toto Ltd., Fukuoka (JP)

( * ) Notice: Subject to any disclaimer, the term of this patent is extended or adjusted under 35 U.S.C. 154(b) by 169 days.

(21) Appl. No.: 14/012,003

(22) Filed: Aug. 28, 2013

(65) Prior Publication Data

US 2014/0063681 A1 Mar. 6, 2014

(30) Foreign Application Priority Data

Aug. 29, 2012 (JP) .................................. 2012-189312
Jul. 4, 2013 (JP) .................................. 2013-141149

(51) Int. Cl.
*H01L 21/683* (2006.01)
*H01L 21/687* (2006.01)

(52) U.S. Cl.
CPC ...... *H01L 21/6833* (2013.01); *H01L 21/68757* (2013.01)

(58) Field of Classification Search
CPC .................... H01L 21/6833; H01L 21/6831
USPC ........................................................ 361/234
See application file for complete search history.

(56) References Cited

U.S. PATENT DOCUMENTS

| 5,767,027 | A | 6/1998 | Sakon et al. | |
|---|---|---|---|---|
| 2009/0159588 | A1* | 6/2009 | Morioka | H01L 21/67103 219/444.1 |
| 2011/0063771 | A1* | 3/2011 | Nishioka | C04B 35/053 361/234 |
| 2013/0201598 | A1* | 8/2013 | Ishikawa et al. | 361/234 |
| 2014/0063682 | A1* | 3/2014 | Anada et al. | 361/234 |
| 2014/0071582 | A1* | 3/2014 | Anada et al. | 361/234 |
| 2015/0279714 | A1* | 10/2015 | Yamaguchi | H02N 13/00 279/128 |

FOREIGN PATENT DOCUMENTS

| JP | H08-119720 A | 5/1996 |
|---|---|---|
| JP | H10-279349 A | 10/1998 |
| JP | 2011-061049 A | 3/2011 |

\* cited by examiner

*Primary Examiner* — Thienvu Tran
*Assistant Examiner* — Angela Brooks
(74) *Attorney, Agent, or Firm* — Carrier Blackman & Associates, P.C.; Joseph P. Carrier; William D. Blackman

(57) ABSTRACT

To provide an electrostatic chuck, including: a ceramic dielectric substrate having a first major surface on which an object to be processed is mounted, and a second major surface on a side opposite the first major surface, the ceramic dielectric substrate being a polycrystalline ceramic sintered body; and an electrode layer interposed between the first major surface and the second major surface of the ceramic dielectric substrate, the electrode layer being integrally sintered with the ceramic dielectric substrate, the ceramic dielectric substrate including a first dielectric layer between the electrode layer and the first major surface, and a second dielectric layer between the electrode layer and the second major surface, and at least the first dielectric layer of the ceramic dielectric substrate having an infrared spectral transmittance in terms of a thickness of 1 millimeter (mm) of not less than 20%.

14 Claims, 7 Drawing Sheets

ELECTROSTATIC CHUCK

CROSS-REFERENCE TO RELATED APPLICATIONS

This application is based upon and claims the benefit of priorities from Japanese Patent Application No. 2012-189312, filed on Aug. 29, 2012 and Japanese Patent Application No. 2013-141149, filed on Jul. 4, 2013; the entire contents of which are incorporated herein by reference.

FIELD

An aspect of the invention relates to an electrostatic chuck, and more specifically relates to an electrostatic chuck capable of maintaining at a desired temperature an object to be processed that is adhered and held.

BACKGROUND

Electrostatic chucks are used as means to adhere and hold an object to be processed (such as a semiconductor wafer or a glass substrate) in a plasma processing chamber that performs etching, chemical vapor deposition (CVD), sputtering, ion implantation, ashing, and the like.

Electrostatic chucks are fabricated by interposing an electrode between ceramic substrates of alumina or the like and sintering the arrangement. Electrostatic chucks apply an electrostatic adhesion-use power to the internal electrode and thereby adhere a substrate such as a silicon wafer or the like by an electrostatic force.

However, after plasma processing, residues or matter generated from the semiconductor wafer or applied films adhere to the inner faces of the chamber. When plasma processing is repeatedly carried out, the residues and generated matter are gradually deposited, and eventually they peel from the inner faces of the chamber and adhere to the surface of the object to be processed such as a semiconductor wafer, a glass substrate, or the like, which causes a reduction in yield.

Therefore, conventionally, periodically, the inside of the chamber is cleaned by plasma, and the residues and generated matter adhering to the inner faces of the chamber are removed. In this case, in some cases, so-called waferless plasma cleaning is carried out, by processing without covering the surface of the electrostatic chuck with a dummy wafer. In waferless plasma cleaning, the surface of the electrostatic chuck is directly exposed to cleaning plasma such as $O_2$ gas, $CF_4$ gas, or the like during cleaning.

When waferless plasma cleaning is carried out for electrostatic chuck, particles are separated from the ceramic surface and erosion occurs at the grain boundaries, so the surface roughness increases. As a result, problems such as reduction in the electrostatic adhesion force, increase in the quantity of leakage of sealing gas, lowering in the heat transfer coefficient of the solid contact interface with the semiconductor wafer, and the like occur, and after a short period of time, it is necessary to replace the electrostatic chuck.

Therefore, Japanese Unexamined Patent Application Publication No. H10-279349 discloses a method of manufacturing an electrostatic chuck with an internal electrode structure that uses high purity alumina as the dielectric body, as a method of suppressing the change in surface roughness due to plasma irradiation by halogen gas or the like.

Japanese Unexamined Patent Application Publication No. H10-279349 discloses using a green sheet that uses alumina powder with 99.5% purity as a conductor by applying a paste including powders such as W, Mo, WC, TiC, TiN or the like.

Also, Japanese Unexamined Patent Application Publication No. H08-119720 discloses the structure of an electrostatic chuck in which a conductor made from Pd on its own or Pd including Ag of not more than 40% by weight is applied to a green sheet that uses alumina powder with purity of not less than 99.9% as the internal electrode.

In recent years, there is a demand for electrostatic chucks that can change the temperature even with large plasma power, in accordance with the types and conditions of wafer processing. It is important that the electrostatic chuck is capable of maintaining the object to be processed at the desired temperature even under these temperature changes.

SUMMARY

According to an aspect of the present invention, an electrostatic chuck includes: a ceramic dielectric substrate having a first major surface on which an object to be processed is mounted, and a second major surface on a side opposite the first major surface, the ceramic dielectric substrate being a polycrystalline ceramic sintered body; and an electrode layer interposed between the first major surface and the second major surface of the ceramic dielectric substrate, the electrode layer being integrally sintered with the ceramic dielectric substrate, the ceramic dielectric substrate including a first dielectric layer between the electrode layer and the first major surface, and a second dielectric layer between the electrode layer and the second major surface, and at least the first dielectric layer of the ceramic dielectric substrate having an infrared spectral transmittance in terms of a thickness of 1 mm of not less than 20%.

DETAILED DESCRIPTION

Figure 1:
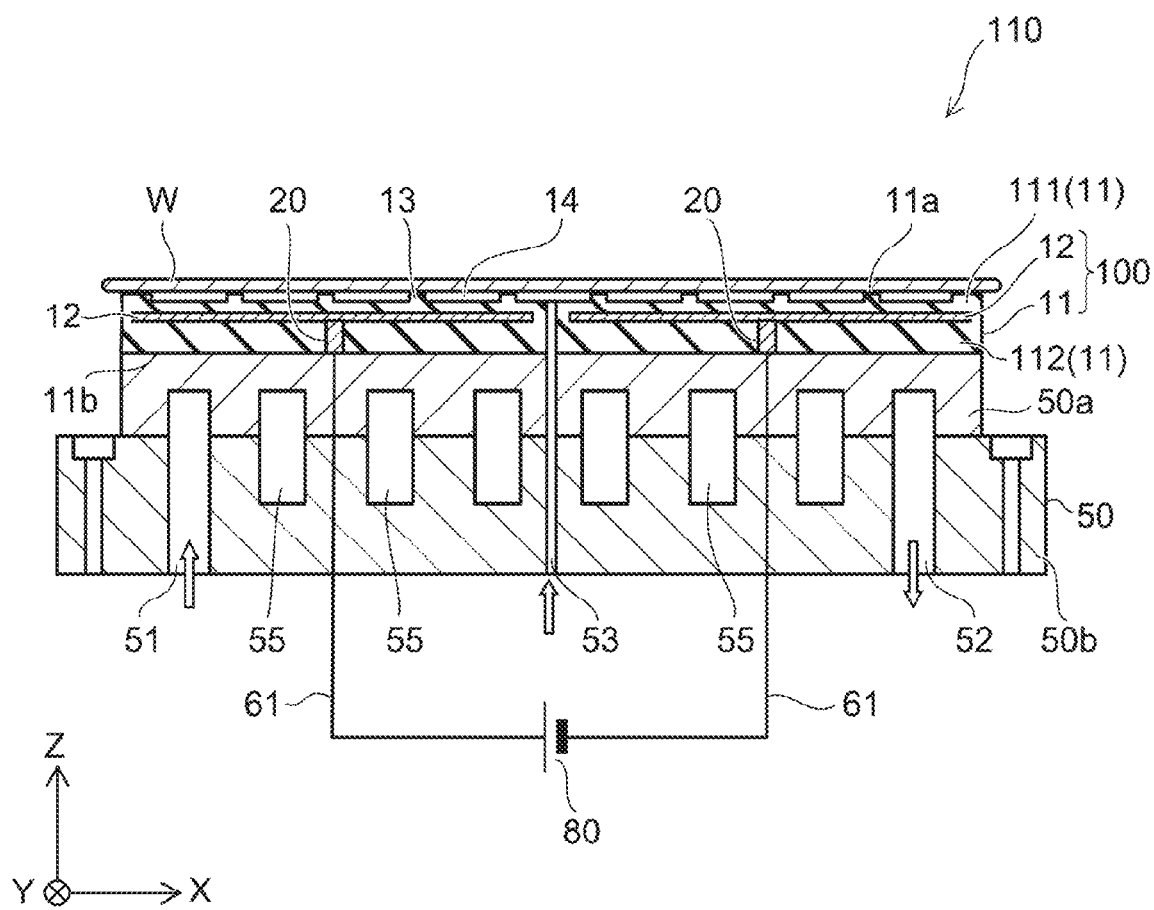
FIG. 1 is a schematic cross-sectional view illustrating the configuration of an electrostatic chuck according to this embodiment.

A first aspect of the present invention is an electrostatic chuck including: a ceramic dielectric substrate having a first major surface on which an object to be processed is mounted, and a second major surface on a side opposite the first major surface, the ceramic dielectric substrate being a polycrystalline ceramic sintered body; and an electrode layer interposed between the first major surface and the second major surface of the ceramic dielectric substrate, the electrode layer being integrally sintered with the ceramic dielectric substrate, the ceramic dielectric substrate including a first dielectric layer between the electrode layer and the first major surface, and a second dielectric layer between the electrode layer and the second major surface, and at least the first dielectric layer of the ceramic dielectric substrate having an infrared spectral transmittance in terms of a thickness of 1 mm of not less than 20%.

According to this electrostatic chuck, infrared light emitted from the plasma source or the object to be processed can efficiently pass through the ceramic dielectric substrate, so it is possible to suppress the accumulation of heat in the object to be processed.

A second aspect of the present invention is the electrostatic chuck according to the first aspect of the invention, wherein the thickness of the first dielectric layer is not less than 100 micrometers.

According to this electrostatic chuck, the thickness of a first dielectric layer is not less than 100 μm, so it is possible to maintain sufficient withstand voltage.

A third aspect of the present invention is the electrostatic chuck according to the second aspect of the invention, wherein crystal grains included in the ceramic dielectric substrate are bonded together by a solid phase sintering or a liquid phase sintering.

According to this electrostatic chuck, the ceramic dielectric substrate does not include a sintering agent, so reduction in the transmittance of infrared light due to the sintering agent does not occur.

A fourth aspect of the present invention is the electrostatic chuck according to the third aspect of the invention, wherein the purity of the ceramic dielectric substrate is not less than 99.9% by weight.

According to this electrostatic chuck, there are few impurities included in the ceramic dielectric substrate, so it is possible to suppress the reduction in the transmittance of infrared light due to the impurities.

A fifth aspect of the present invention is the electrostatic chuck according to the second aspect of the invention, wherein the external diameter of foreign matter included in the first dielectric layer is not more than 3 mm.

According to this electrostatic chuck, the external diameter of any foreign matter included in the first dielectric layer is not more than 3 mm, so reduction in the transmittance of infrared light due to the foreign matter is suppressed, and control of the temperature of the object to be processed is not hindered.

A sixth aspect of the present invention is the electrostatic chuck according to the fifth aspect of the invention, wherein the external diameter of the foreign matter is not more than 2 mm.

According to this electrostatic chuck, the external diameter of any foreign matter included in the first dielectric layer is not more than 2 mm, so reduction in the transmittance of infrared light due to the foreign matter is suppressed, and control of the temperature of the object to be processed is not hindered A seventh aspect of the present invention is the electrostatic chuck according to the second aspect of the invention, wherein an occupancy ratio of foreign matter included in the first dielectric layer per unit area is not more than 0.16 area percent.

According to this electrostatic chuck, the occupancy ratio of foreign matter included in the first dielectric layer per unit area is not more than 0.16 area percent, so the reduction in the transmittance of infrared light due to the foreign matter is suppressed, and control of the temperature of the object to be processed is not hindered.

An eighth aspect of the present invention is the electrostatic chuck according to the first aspect of the invention, wherein the electrode layer includes a first portion having conductivity, and a second portion having infrared spectral transmittance greater than the first portion.

According to this electrostatic chuck, a second portion is provided having a higher infrared spectral transmittance than a first portion that has conductivity, so it is possible to efficiently transmit infrared light through the electrode layer.

A ninth aspect of the present invention is the electrostatic chuck according to the eighth aspect of the invention, wherein the first portion is directly bonded to the second portion.

According to this electrostatic chuck, there is no sintering agent between the first portion and the second portion, so reduction in the transmittance of infrared light due to the sintering agent does not occur.

A tenth aspect of the present invention is the electrostatic chuck according to the eighth aspect of the invention, wherein the second portion mechanically bonds the first dielectric layer and the second dielectric layer, and the second portion optically connects between the first dielectric layer and the second dielectric layer so that infrared light passes through the electrode layer.

According to this electrostatic chuck, the mechanical bond between the ceramic dielectric substrate and the electrode layer is improved, and it is possible to increase the transmittivity of infrared light at the electrode layer.

An eleventh aspect of the present invention is the electrostatic chuck according to the tenth aspect of the invention, wherein the second portion includes a portion that extends in a direction not parallel to the first major surface.

According to this electrostatic chuck, the second portion includes a portion that extends in a direction not parallel to a first major surface, so infrared light can pass in the direction not parallel to the first major surface. In this way, infrared light passes both the ceramic dielectric substrate and the electrode layer, so it is possible to suppress the accumulation of heat in the object to be processed and the ceramic dielectric substrate.

A twelfth aspect of the present invention is the electrostatic chuck according to the eighth aspect of the invention, wherein the mean grain size of crystals included in the ceramic dielectric substrate is greater than the mean grain size of crystals included in the second portion.

According to this electrostatic chuck, the mean grain size of the crystals included in the second portion is small, so it is possible to both not obstruct the conductivity network of the first portion, and, to achieve the performance of transmitting infrared light.

A thirteenth aspect of the present invention is the electrostatic chuck according to the eighth aspect of the invention, wherein the material of the second portion is the same as the material of the ceramic dielectric substrate.

According to this electrostatic chuck, it is possible to efficiently transmit infrared light through both the ceramic dielectric substrate and the electrode layer.

A fourteenth aspect of the present invention is the electrostatic chuck according to the first aspect of the invention, wherein the material of the crystals included in the ceramic dielectric substrate is any of $Al_2O_3$, $Y_2O_3$, and YAG.

According to this electrostatic chuck, it is possible to improve the transmittivity of infrared light, the withstand voltage, and the plasma durability.

Embodiments of the invention will now be described with reference to the drawings. Note that the same numerals are applied to similar constituent elements in the drawings and detailed descriptions of such constituent elements are appropriately omitted.

FIG. 1 is a schematic cross-sectional view illustrating the configuration of an electrostatic chuck according to this embodiment.

As illustrated in FIG. 1, an electrostatic chuck 110 according to this embodiment includes a ceramic dielectric substrate 11, and an electrode layer 12.

The ceramic dielectric substrate 11 is, for example, a flat plate-like substrate made of a polycrystalline ceramic sintered body, and includes a first major surface 11a on which an object to be processed W such as a semiconductor wafer or the like is mounted, and a second major surface 11b on a side opposite the first major surface 11a.

The electrode layer 12 is interposed between the first major surface 11a and the second major surface 11b of the ceramic dielectric substrate 11. In other words, the electrode layer 12 is formed so as to be inserted into the ceramic dielectric substrate 11. The electrode layer 12 is integrally sintered with the ceramic dielectric substrate 11. An electrostatic chuck substrate 100 is a plate-like structure that includes the ceramic dielectric substrate 11 and the electrode layer 12 provided in the ceramic dielectric substrate 11.

The electrostatic chuck 110 applies an adhere and hold voltage 80 to the electrode layer 12, thereby generating charge on the first major surface 11a side of the electrode layer 12 and using a resulting electrostatic force to adhere and hold the object to be processed W.

In the description of this embodiment, the direction that joins the second major surface 11b and the first major surface 11a is denoted as the Z direction, one of the directions perpendicular to the Z direction is denoted as the X direction, and the direction perpendicular to the Z direction and the X direction is denoted as the Y direction.

The electrode layer 12 is provided along the first major surface 11a and the second major surface 11b of the ceramic dielectric substrate 11. The electrode layer 12 is an adhering electrode for adhering and holding the object to be processed W. The electrode layer 12 may be a unipolar type or a bipolar type. Also, the electrode layer 12 may be a tripolar type or another multi-polar type. The number and arrangement of electrode layers 12 are selected as appropriate. The electrode layer 12 illustrated in FIG. 1 is of the bipolar type, having two poles in the same plane.

The ceramic dielectric substrate 11 includes a first dielectric layer 111 between the electrode layer 12 and the first major surface 11a, and a second dielectric layer 112 between the electrode layer 12 and the second major surface 11b. At least the first dielectric layer 111 of the ceramic dielectric substrate 11 has an infrared spectral transmittance of not less than 20%. In this embodiment, the infrared spectral transmittance is the value in terms of a thickness of 1 mm.

By making the infrared spectral transmittance of at least the first dielectric layer 111 of the ceramic dielectric substrate 11 not less than 20%, the infrared light emitted from the object to be processed W when the object to be processed W is mounted on the first major surface 11a can efficiently pass through the ceramic dielectric substrate 11. Therefore, it is difficult for heat to accumulate in the object to be processed W, and the controllability of the temperature of the object to be processed W is increased.

For example, if the electrostatic chuck 110 is used within a chamber where plasma processing is carried out, the temperature of the object to be processed W can easily rise as the plasma power is increased. In the electrostatic chuck 110 according to this embodiment, the heat transmitted to the object to be processed W by the plasma power is efficiently transmitted to the ceramic dielectric substrate 11. Therefore, the object to be processed W can be efficiently cooled and maintained at its desired temperature.

In the electrostatic chuck 110 according to this embodiment, preferably, the infrared spectral transmittance of the second dielectric layer 112 is not less than 20%, in addition to the first dielectric layer 111. By making the infrared spectral transmittance of the first dielectric layer 111 and the second dielectric layer 112 not less than 20%, the infrared light emitted from the object to be processed W is more efficiently transmitted through the ceramic dielectric substrate 11, so it is possible to improve the controllability of the temperature of the object to be processed W.

Here, a specific example of the configuration of the electrostatic chuck 110 is described.

As illustrated in FIG. 1, the electrostatic chuck 110 is attached to a baseplate 50. To attach the electrostatic chuck 110 to the baseplate 50, a heat-resistant resin such as silicone or the like, indium bonding, brazing, or the like can be used. The bonding material is selected as appropriate based on the range of temperature used, cost, and the like, but more preferably, the bonding material easily transmits infrared light.

The baseplate 50 is, for example, divided into an upper portion 50a and a lower portion 50b made of aluminum. A communication path 55 is provided between the upper portion 50a and the lower portion 50b. The communication path 55 has a first end connected to an input path 51 and a second end connected to an output path 52.

The baseplate 50 plays the role of adjusting the temperature of the electrostatic chuck 110. For example, when the electrostatic chuck 110 is cooled, a cooling medium is caused to flow from the input path 51, pass through the communication path 55, and flow out from the output path 52. Accordingly, heat from the baseplate 50 is absorbed by the cooling medium, and the electrostatic chuck 110 attached to the baseplate 50 can be cooled.

On the other hand, when the electrostatic chuck 110 is to retain heat, a heat-holding medium can be supplied to the communication path 55. Alternatively, a heating element can be included in the electrostatic chuck 110 and the baseplate 50. In this way, when the temperature of the electrostatic chuck 110 is adjusted via the baseplate 50, the temperature of the object to be processed W adhered and held by the electrostatic chuck 110 can be easily adjusted.

Also, on the first major surface 11a side of the ceramic dielectric substrate 11, protrusions 13 are provided as required, and grooves 14 are provided between the protrusions 13. The grooves 14 are in communication, and spaces are formed between a rear surface of the object to be processed W mounted on the electrostatic chuck 110 and the grooves 14.

The grooves 14 are connected to introduction paths 53 which pierce through the baseplate 50 and the ceramic dielectric substrate 11. When a transfer gas such as helium (He) or the like is introduced from introduction paths 53 with the object to be processed W in a state of being adhered and held, the transfer gas flows into the space provided between the object to be processed W and the grooves 14, and the object to be processed W can be directly cooled by the transfer gas.

Here, by appropriately selecting the height of the protrusions 13 (depth of the grooves 14), an area ratio of the protrusions 13 and grooves 14, and shapes thereof, a temperature of the object to be processed W and particles adhering to the object to be processed W can be controlled to a preferred state.

A connection portion 20 is provided on the second major surface 11b of the ceramic dielectric substrate 11. A contact electrode 61 is provided in the upper portion 50a of the baseplate 50 in a position corresponding to the position of the connection portion 20. Hence, when the electrostatic chuck 110 is attached to the upper portion 50a of the baseplate 50, the contact electrode 61 contacts the connection portion 20 and electrical conduction can thereby be obtained between the contact electrode 61 and the electrode layer 12 via the connection portion 20.

For the contact electrode 61, a moveable probe may, for example, be used. Accordingly, a reliable connection is obtained between the contact electrode 61 and the connection portion 20, and damage to the connection portion 20 caused by the contact of the contact electrode 61 is minimized. Note that the contact electrode 61 is not limited to that described above, and may take any form. The contact electrode 61 may simply contact the connection portion 20, or engage with or be screwed into the connection portion 20.

Next, the ceramic dielectric substrate 11 is specifically described.

The material of the crystals included in the ceramic dielectric substrate 11 may include, for example, any of $Al_2O_3$, $Y_2O_3$, and YAG. By using this material, it is possible to increase the transmittivity of infrared light, the insulation resistance, and the plasma durability of the ceramic dielectric substrate 11.

Preferably, the crystal grains included in the ceramic dielectric substrate 11 are joined together by solid phase sintering or liquid phase sintering. In other words, crystal grains are bonded together without sintering agent between the crystals. By not using sintering agent, a reduction in the transmittance of infrared light due to the sintering agent does not occur in the ceramic dielectric substrate 11.

Preferably, the purity of the ceramic dielectric substrate 11 is not less than 99.9% by weight. By having few impurities in the ceramic dielectric substrate 11, it is possible to suppress the reduction in the transmittance of infrared light due to impurities.

The first dielectric layer 111 of the ceramic dielectric substrate 11 has a thickness of not less than 100 μm. When the thickness of the first dielectric layer 111 is not less than 100 μm, it is possible to maintain sufficient withstand voltage in the electrostatic chuck 110. The thickness of the first dielectric layer 111 greatly affects the adhesion force, so it can be set as appropriate in order that the temperature of the object to be processed W will be the desired temperature. In this embodiment, the thickness of the first dielectric layer 111 can be set to, for example, from 100 μm to 1000 μm, and more preferably from 100 μm to 500 μm.

The thickness of the second dielectric layer 112 of the ceramic dielectric substrate 11 can likewise be set as appropriate. The overall thickness of the electrostatic chuck substrate 100 in which the ceramic dielectric substrate 11 and the electrode layer 12 are provided is, for example, from approximately 0.5 mm to 10 mm, taking into consideration the mechanical strength, cooling properties, heating properties, reliability, yield, and the like of the ceramic dielectric substrate 11. The overall thickness of the electrostatic chuck substrate 100 is preferably from approximately 0.5 mm to 7 mm. The overall thickness of the electrostatic chuck substrate 100 is more preferably from approximately 0.5 mm to 5 mm.

According to the knowledge obtained by the inventors, the advantages of this embodiment are greater for a relatively thick ceramic dielectric substrate 11 than for a relatively thin ceramic dielectric substrate 11. From the effect of the ceramic dielectric substrate 11 passing infrared light, it is possible to reduce temperature differences produced in the ceramic dielectric substrate 11. As a result, the cooling properties of the relatively thick ceramic dielectric substrate 11 are more excellent than the cooling properties of the relatively thin ceramic dielectric substrate 11. The heating properties of the relatively thick ceramic dielectric substrate 11 are more excellent than the heating properties of the relatively thin ceramic dielectric substrate 11.

For example, in some cases, a heater (not illustrated) that raises the temperature of the object to be processed W is provided. In this case, the heater is incorporated in the second dielectric layer 112, for example. Alternatively, the heater may be provided in the same position as the second major surface 11b, or it may be incorporated in the baseplate 50.

When the thickness of the ceramic dielectric substrate 11 increases, the thickness of the second dielectric layer 112 increases. Therefore, the distance between the electrode layer 12 and the heater increases. In this way, it is possible to ensure a longer insulation distance from the electrode layer 12 to the heater, and it is possible to increase the reliability of the electrostatic chuck 110.

As described later, one example of a method of manufacturing the electrostatic chuck 110 is to form a sheet. For example, by varying the number of laminations of the sheet, it is possible to adjust the thickness of the ceramic dielectric substrate 11. For example, if the thickness of a sintered body is increased, the load of the sintered body increases. According to the knowledge obtained by the inventors, when the load of the sintered body increases, warping of the sintered body decreases. In this way, the thicknesses of the first dielectric layer 111 and the second dielectric layer 112 and the dielectric layer are substantially uniform. Therefore, the adhesion force generated by the electrostatic chuck 110 is also uniform, and the temperature of the object to be processed W such as a semiconductor wafer or the like becomes substantially uniform.

Next, the electrode layer 12 is specifically described.

Figure 2A:
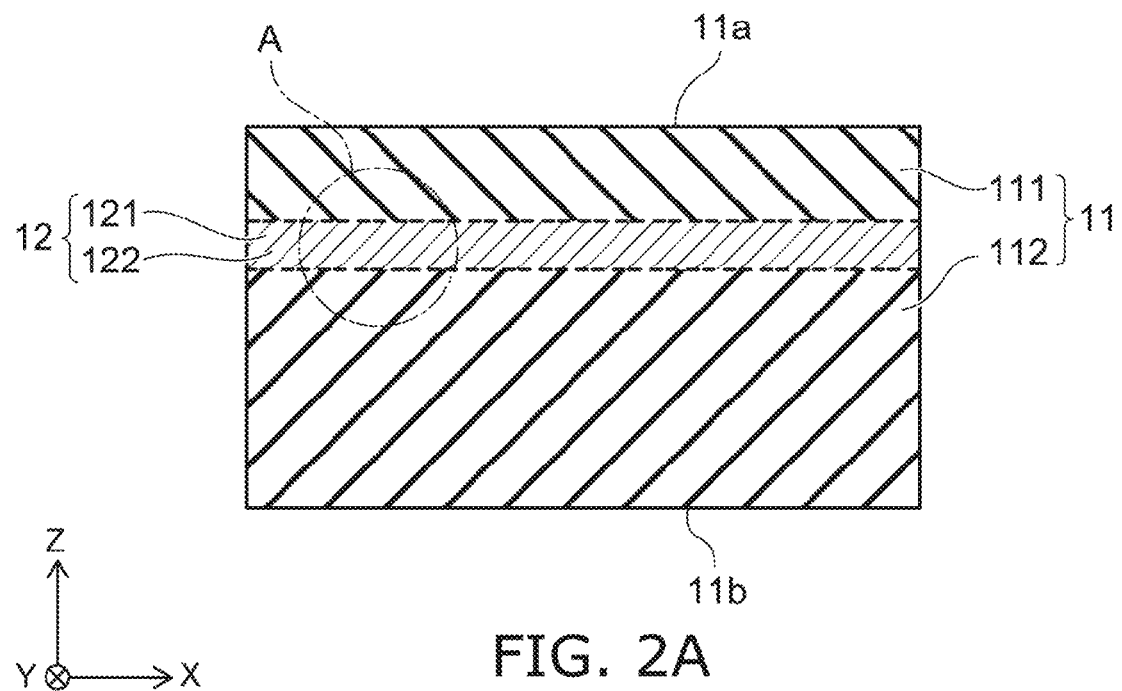
FIG. 2A and FIG. 2B are schematic cross-sectional views illustrating a configuration of the electrode layer.
Figure 2B:
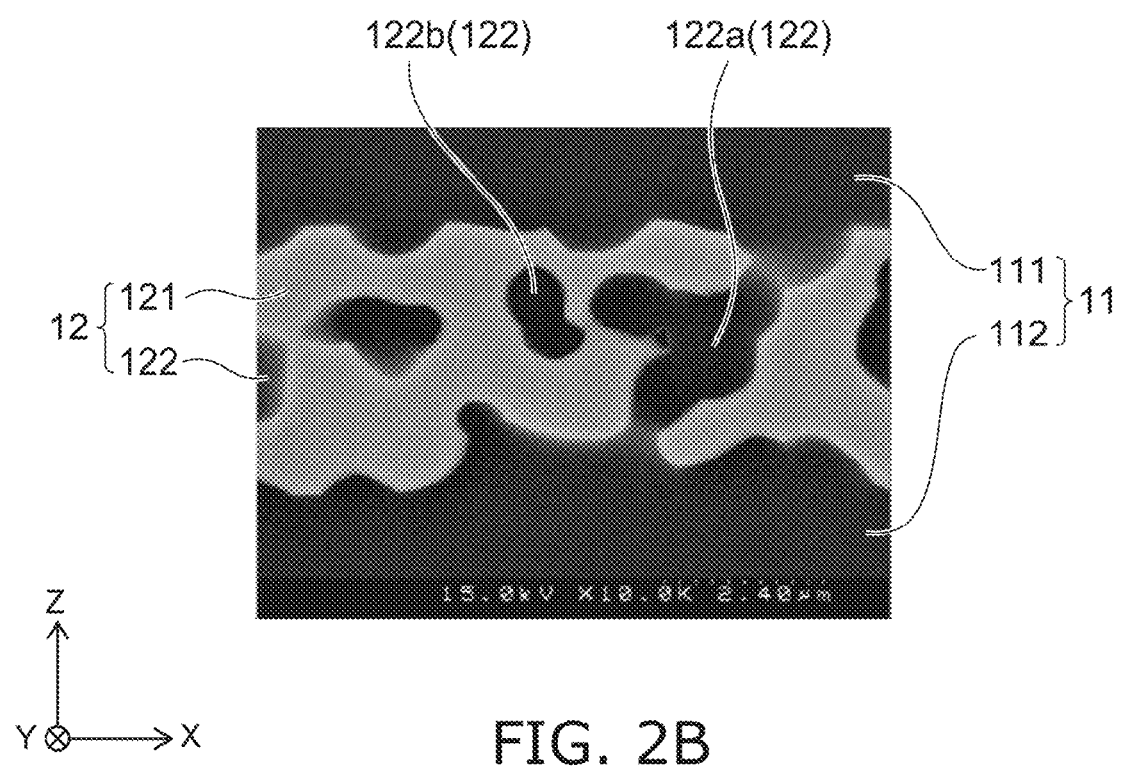

FIG. 2A and FIG. 2B are schematic cross-sectional views illustrating a configuration of the electrode layer.

FIG. 2A illustrates a schematic cross-sectional view of an enlarged portion of the electrode layer, and FIG. 2B shows a scanning electron microscope (SEM) image of a cross section at the portion A illustrated in FIG. 2A.

As illustrated in FIG. 2A, the electrode layer 12 is provided between the first dielectric layer 111 and the second dielectric layer 112 of the ceramic dielectric substrate 11. The electrode layer 12 is integrally sintered with the ceramic dielectric substrate 11. The thickness of the electrode layer 12 is approximately 15 μm.

As shown in FIG. 2B, the electrode layer 12 includes a first portion 121 and a second portion 122. The first portion 121 has conductivity. The first portion 121 includes a metal material. Palladium (Pd), platinum (Pt) or the like can be used as the metal material. In this embodiment, Pd is used as the material of the first portion 121.

The first portion 121 includes a continuous region where particles of the metal material are bonded together. In the SEM cross-sectional image shown in FIG. 2B, a plurality of regions as first portions 121 is shown, but each of the regions is connected at some location. Therefore, when a voltage is applied to the electrode layer 12, each of the regions of the first portion 121 is at the same potential.

The second portion 122 is a portion with a higher infrared spectral transmittance than the first portion 121. The material of the second portion 122 is the same as the material of the ceramic dielectric substrate 11. The material of the second portion 122 is, for example, a polycrystalline ceramic sintered body, the same as for the ceramic dielectric substrate 11.

The second portion 122 is provided so as to link the first dielectric layer 111 and the second dielectric layer 112. The second portion 122 includes a portion 122a that extends in a direction not parallel to the direction along the first major surface 11a (the direction along the X-Y plane). The portion 122a connects the first dielectric layer 111 and the second dielectric layer 112.

The second portion 122 is provided so as to be embedded between the particles of metal material in the first portion 121.

In other words, the first portion 121 is in the form of, for example, an ant's nest. The second portion 122 is provided so that it can enter the gaps of the first portion 121. The second portion 122 includes a portion 122b enclosed by the metal particles of the first portion 121, and the portion 122a that extends so as to penetrate the first portion 121 in the Z direction.

The second portion 122 mechanically bonds the first dielectric layer 111 and the second dielectric layer 112. In other words, the portion 122a of the second portion 122 is integrally sintered with the first dielectric layer 111 and the second dielectric layer 112. The portion 122a has the function of joining the first dielectric layer 111 and the second dielectric layer 112. In this way, it is possible to increase the mechanical bonding between the electrode layer 12 and the ceramic dielectric substrate 11.

The second portion 122 optically connects between the first dielectric layer 111 and the second dielectric layer 112. In other words, the portion 122a of the second portion 122 is provided continuously so that it links the first dielectric layer 111 and the second dielectric layer 112. Therefore, the second portion 122 is an optical path that can transmit infrared light. The material of the second portion 122 is the same as the material of the ceramic dielectric substrate 11, so the portion 122a can efficiently transmit infrared light together with the ceramic dielectric substrate 11.

The electrode layer 12 is a composite mixture of the first portion 121 and the second portion 122, so it has a configuration that enables it to transmit infrared light, while providing conductivity. By incorporating the electrode layer 12 in the ceramic dielectric substrate 11 in this way, infrared light can pass through both the ceramic dielectric substrate 11 and the electrode layer 12, so it is possible to suppress the accumulation of heat in the object to be processed W mounted on the first major surface 11a.

Preferably, the first portion 121 and the second portion 122 are directly joined in the electrode layer 12. In other words, the first portion 121 and the second portion 122 are in mutual contact. There is no sintering agent between the first portion 121 and the second portion 122. As a result, the transmittance of infrared light is not reduced by the sintering agent.

The mean grain size of the crystals included in the ceramic dielectric substrate 11 is greater than the mean grain size of the crystals included in the second portion 122 of the electrode layer 12. In other words, the mean grain size of the crystals included in the second portion 122 is not greater than the mean grain size of the crystals included in the ceramic dielectric substrate 11.

In a cross-section along the X-Y plane of the electrode layer 12, the occupancy ratio of the second portion 122 is not less than 12 area percent and not more than 65 area percent, and preferably is not less than 15 area percent and not more than 58 area percent, and more preferably is not less than 18 area percent and not more than 49 area percent.

Also, in a cross-section along the Z-X plane of the electrode layer 12, the occupancy ratio of the first portion 121 relative to the second portion 122 is not less than 30 area percent and not more than 90 area percent, and preferably is not less than 40 area percent and not more than 80 area percent, and more preferably is not less than 42 area percent and not more than 73 area percent.

Figure 3A:
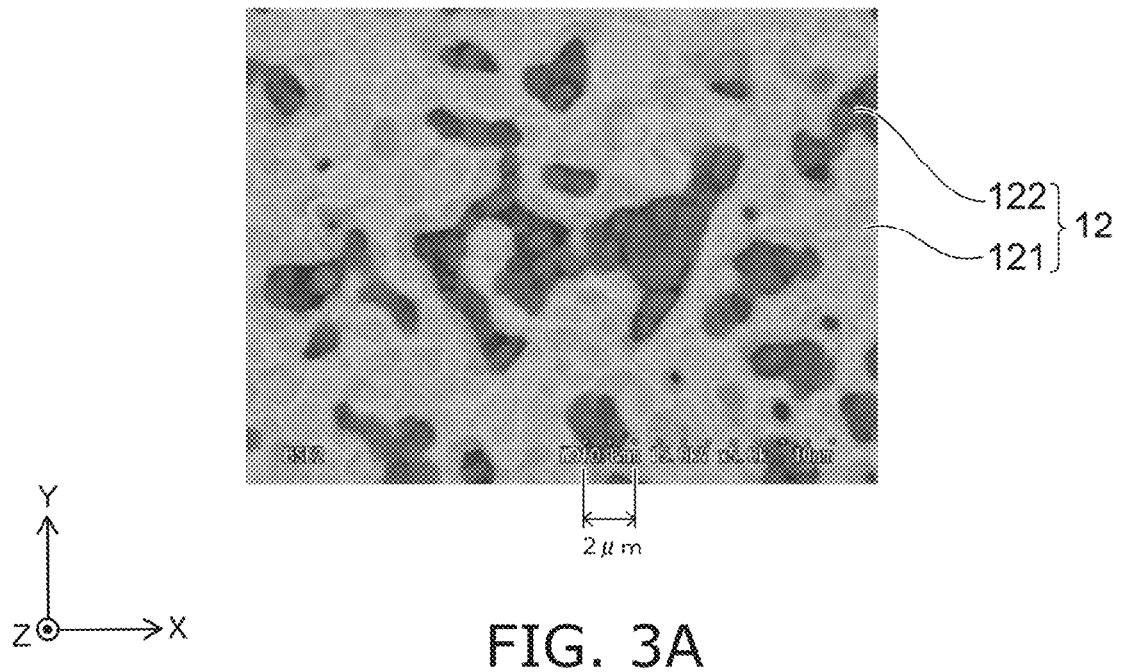
FIG. 3A and FIG. 3B show the surface of the electrostatic chuck.
Figure 3B:
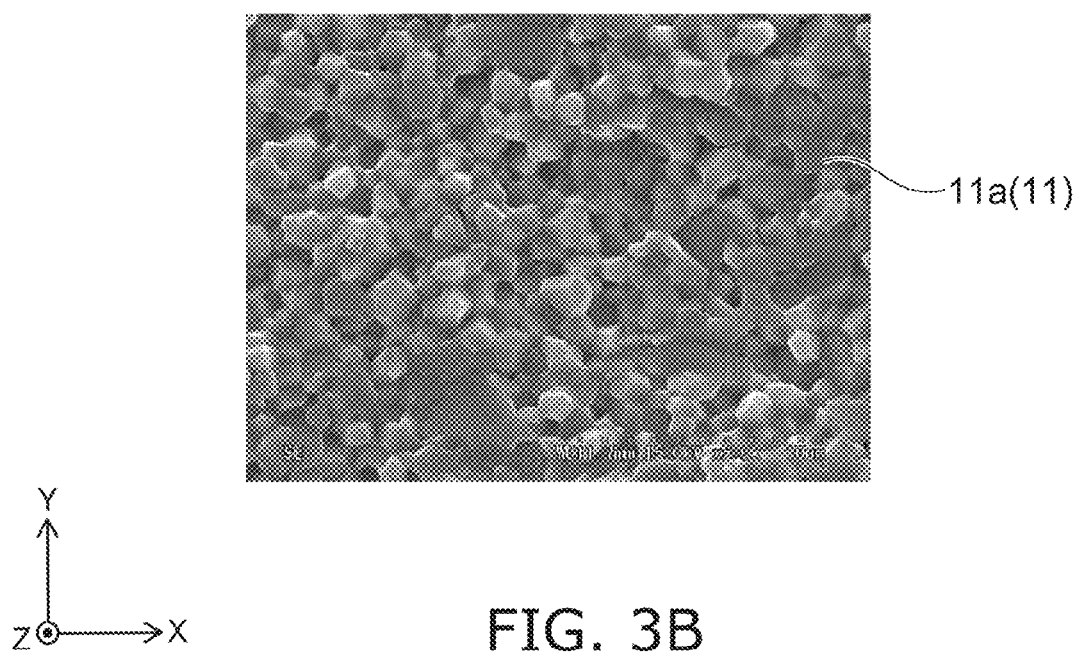

FIG. 3A and FIG. 3B show the surface of the electrostatic chuck.

FIG. 3A is an SEM image of the surface of the electrode layer 12, and FIG. 3B is an SEM image of the surface (first major surface 11a) of the ceramic dielectric substrate 11.

Based on the SEM image shown in FIG. 3A, it is found by measuring 100 crystal grains included in the second portion 122 of the electrode layer 12 that the mean grain size is approximately 1.0 µm. On the other hand, based on the SEM image shown in FIG. 3B, it is found by measuring 100 crystal grains included in the ceramic dielectric substrate 11 that the mean grain size is approximately 1.7 µm.

Here, the mean grain size is calculated by the following method, for example. Namely, the ceramic dielectric substrate 11 is prepared by carrying out processes such as sectioning, thermal etching, and the like, and carrying out measurements at a plurality of locations on SEM photographs with a 5000 magnification in order to determine the grain boundary. At a single measurement location, the major axis when ellipse approximation is performed to the grain boundary is taken to be the grain size. Then, the mean value of 100 measurements of grain size is taken to be the mean grain size.

When the mean grain size of the crystals included in the second portion 122 is greater than the mean grain size of the crystals included in the ceramic dielectric substrate 11, the conductive network of the first portion 121 can be easily disrupted. On the other hand, when the mean grain size of the crystals included in the second portion 122 is not greater than the mean grain size of the crystals included in the ceramic dielectric substrate 11, the conductive network of the first portion 121 is not disrupted, and, transmission of infrared light is also achieved.

Next, an example of a manufacturing method of the electrostatic chuck 110 according to this embodiment is described. In this embodiment, an example of sheet forming is provided, but the manufacturing method is not limited to this, and hot pressing or extrusion forming or the like can be used.

(Fabrication of Alumina Green Sheet)

A binder, a solvent, and the like are added to alumina powder, and after mixing and pulverizing the mixture in a ball mill, defoaming is performed, and a green sheet is formed. Preferably, the aluminum powder to be used has few impurities, and the purity is not less than 99.9% by weight, and more preferably is not less than 99.99% by weight. At least one type of resin can be selected as the binder, selected from the group consisting of vinyl resin such as polyvinyl alcohol, polyvinyl butyral, polyvinyl chloride, and the like; a cellulose resin such as methyl cellulose, ethyl cellulose, hydroxyethyl cellulose, and the like; and an acrylic resin such as polyacrylic ester, polymethyl methacrylate, and the like. Alternatively, a water-soluble binder resin, or another commonly used binder that can be used for processing ceramic sheet products may be used. Next, a single solvent or a mixture of two or more solvents selected from methyl ethyl ketone, ethyl alcohol, isopropyl alcohol, toluene, diethyl ether, ethylene trichloride, methanol, and the like, can be used as the solvent. However, provided the solvent is capable of dissolving the binder, there is no limitation on the solvent.

(Production and Formation of Metallized Paste)

The metallized paste for forming the electrode layer 12 is produced as follows. Binder and the like is added to the mixture of alumina powder and Pd powder, and mixed in a three-roll mill to form metallized paste.

Next, using the metallized paste, an internal electrode pattern to form the electrode layer 12 is printed on the alumina green sheet by the screen printing method. Also, metallized paste may be printed on another alumina green sheet with through holes and via holes provided for connecting to external terminals to be formed later. Also, formation of the electrode is not limited to the screen printing method, but deposition methods such as physical vapor deposition (PVD), CVD and the like may be used.

(Lamination of the Alumina Green Sheets)

Next, the alumina green sheets are mutually positioned, laminated, and thermocompression bonded, to fabricate a stacked body with the overall required thickness.

(Sintering, and HIP Processing of Laminated Alumina Green Sheets)

Next, the stacked body is sintered at not less than 1250° C. and not more than 1700° C., and more preferably at not less than 1300° C. and not more than 1450° C., sintering the internal electrode pattern at the same time. The sintering is not limited to a sintering atmosphere such as an air atmosphere, a reducing atmosphere, or the like. After sintering, the temperature and pressure are set again and the hot isostatic pressing (HIP) process is carried out. The HIP process conditions are preferably a pressurizing gas (for example, Ar) pressure of not less than approximately 1000 atmospheres, and the temperature of not less than 1200° C. and not more than 1600° C., depending on the sintering temperature.

(Formation of External Terminals)

Next, an external electrode is formed. A counterboring process using a drill or the like is carried out on one side of the dielectric body (alumina sintered body), to expose the internal through hole or via hole. An electrode terminal is connected to this counterbored portion by brazing, soldering, using conductive adhesive, or the like.

(Processing the Alumina Sintered Body)

The front and rear surfaces of the alumina sintered body (ceramic dielectric substrate 11) are ground, so that the thickness of the first dielectric layer 111 of the alumina sintered body substrate (the distance from the adhering surface to the electrode layer 12) is the desired thickness.

(Joining)

The ceramic dielectric substrate 11 in which the electrode layer 12 is formed and the baseplate 50 are joined.

(Producing a Surface Pattern)

After grinding the ceramic dielectric substrate 11 that has been joined to the baseplate 50 to obtain the required thickness, the protrusions 13 are formed to the required size and height on the surface by the sandblasting method.

The electrostatic chuck 110 with the protrusions 13 formed on the surface can be obtained as described above.

WORKING EXAMPLES

The following is a further description of the electrode layer 12 based on working examples.

Pd powder and alumina powder (purity 99.99%) were prepared, metallized paste was produced, and the electrostatic chuck was fabricated.

Figure 4:
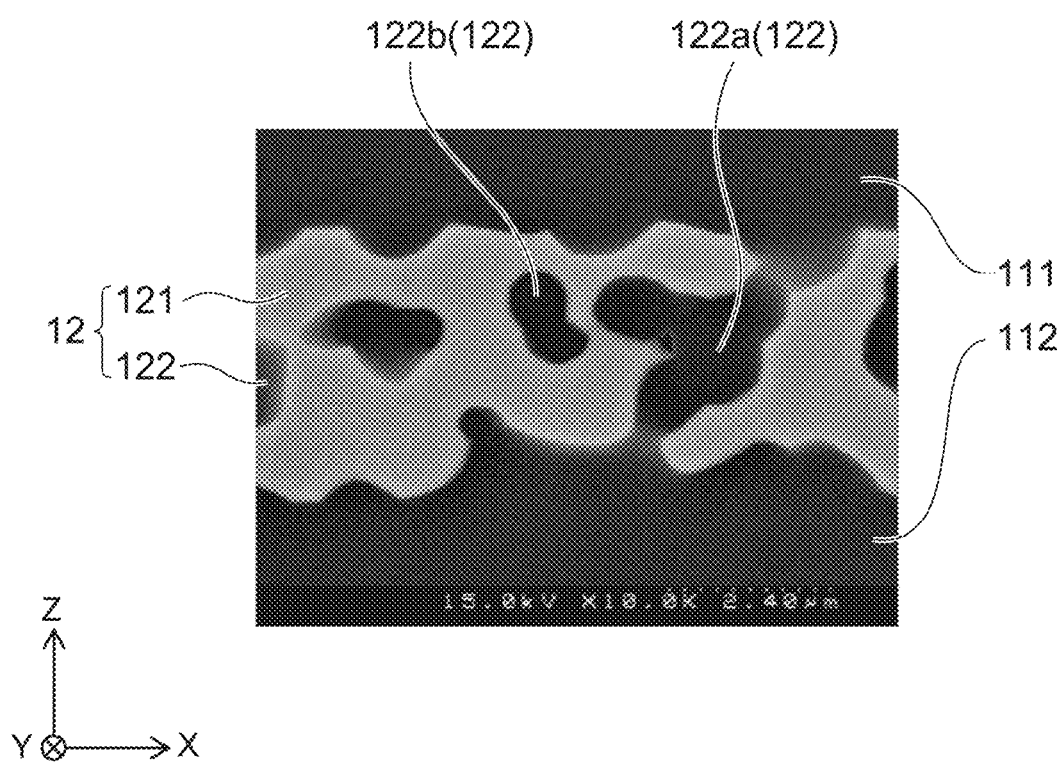
FIG. 4 shows the electrode layer.

FIG. 4 shows the electrode layer.

FIG. 4 shows an SEM image of a cross-section of the electrode layer 12 after sintering. In FIG. 4, white portions are Pd.

As shown in FIG. 4, the electrode layer 12 is precise with no gaps, and the Pd particles are in close contact and continuous. Therefore, the conductivity is good, and in addition, there is good contact between the electrode layer 12 and the high purity alumina layers (the first dielectric layer 111 and the second dielectric layer 112) above and below the electrode layer 12.

Also, mixed sintering was carried out with the high purity alumina and electrode raw materials without the use of sintering agent or the like, so the contact surface area between the alumina is reduced, and the alumina particles added to the electrode layer 12 remain as very fine particles without growing larger. In this way, it is possible to fabricate the electrode layer 12 satisfying both close contact and conductivity.

(Evaluation of Plasma Resistance)

Plasma irradiation tests were carried out and evaluated on samples as described below, for the reduction (durability) in surface roughness of the alumina sintered body due to plasma irradiation. The test samples were obtained by cutting a portion of the electrostatic chucks fabricated in Working Examples 1 and 2, and grinding their surfaces to a surface roughness Ra of not more than 0.03 μm. These test samples were subject to plasma irradiation, and the change in surface roughness Ra was measured. The plasma irradiation was carried out using a reactive ion etching device (Anelva Corporation, DEA-506), and etching gas of $CF_4:O_2=4:1$ at 1000 W for 30 hours.

As a result, the surface roughness Ra after 10 hours of plasma irradiation was 0.12 μm, and after 30 hours of the irradiation, the surface roughness Ra was 0.13 μm. There was almost no change in the surface roughness Ra for not less than 10 hours of plasma irradiation, so it was confirmed that an alumina sintered body with good plasma resistance had been fabricated.

The infrared spectral transmittance of the electrostatic chuck 110 is described below.

Figure 5A:
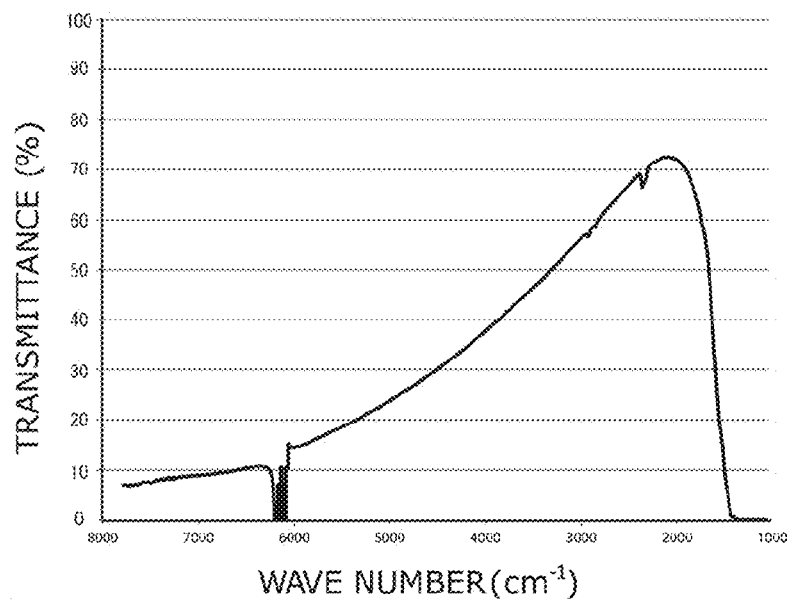
FIG. 5A and FIG. 5B show the infrared spectral transmittance of the ceramic dielectric substrate.
Figure 5B:
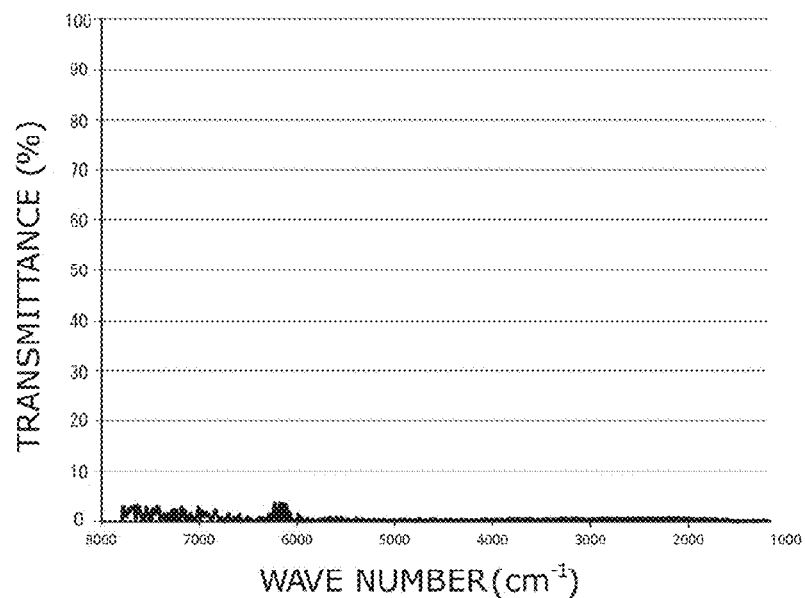

FIG. 5A and FIG. 5B show the infrared spectral transmittance of the ceramic dielectric substrate.

FIG. 5A shows the infrared spectral transmittance of the ceramic dielectric substrate 11 (purity 99.99% by weight) used in the electrostatic chuck 110 according to this embodiment. FIG. 5B shows the transmittance of infrared light of a ceramic dielectric substrate using low purity alumina (purity 90.0% by weight).

In both graphs, the horizontal axis is the wave number (reciprocal of wavelength: $cm^{-1}$), and the vertical axis is the transmittance.

The transmittances are the results obtained by fabricating 1 mm thick samples of the ceramic dielectric substrates, and measuring the transmittance of each sample.

As shown in FIG. 5A, the transmittance of the ceramic dielectric substrate 11 used in the electrostatic chuck 110 according to this embodiment exceeded 1% for wave numbers of not less than 1400 $cm^{-1}$, and the transmittance exceeded 20% for wave number up to about 5000 $cm^{-1}$.

On the other hand, as shown in FIG. 5B, the transmittance of the ceramic dielectric substrate that used low purity alumina did not exceed 1% at almost all wave numbers.

In this way, in the ceramic dielectric substrate 11 used in the electrostatic chuck 110 according to this embodiment, the infrared spectral transmittance, namely, the transmittance in the infrared region (wave number of not less than approximately 2000 $cm^{-1}$ and not more than approximately 4000 $cm^{-1}$) is not less than 20%.

Figure 6A:
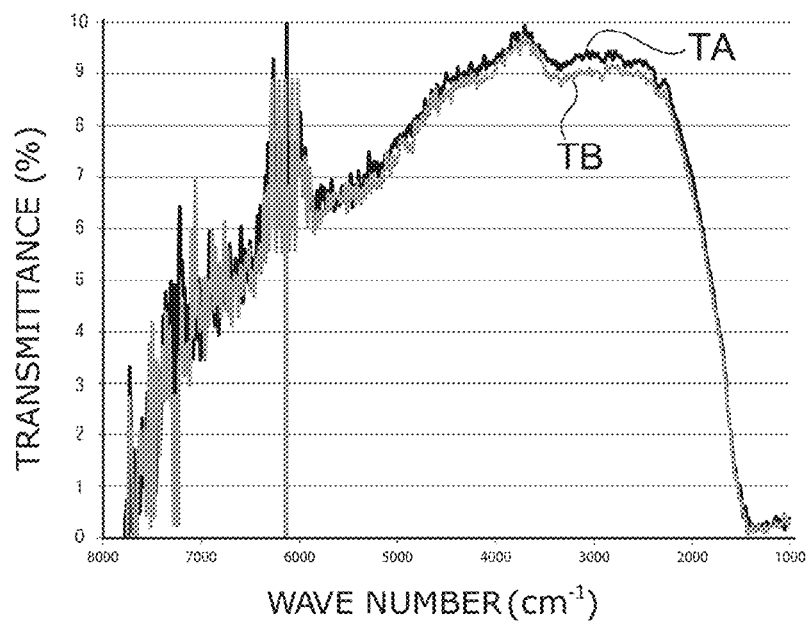
FIG. 6A and FIG. 6B show the infrared spectral transmittance of the ceramic dielectric substrate that includes the electrode layer.
Figure 6B:
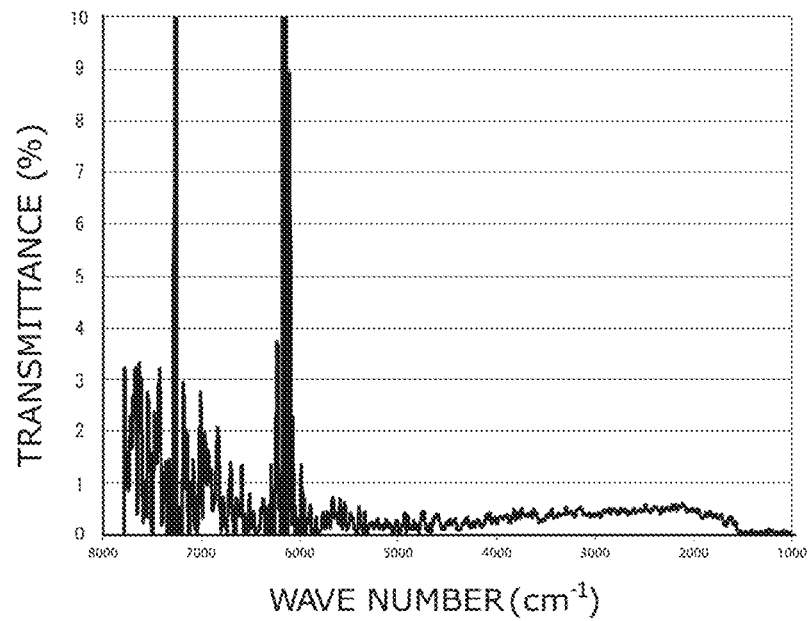

FIG. 6A and FIG. 6B show the infrared spectral transmittance of the ceramic dielectric substrate that includes the electrode layer.

FIG. 6A shows the infrared spectral transmittance of the electrostatic chuck 110 that includes the electrode layer 12 according to this embodiment. FIG. 6A shows the infrared spectral transmittance (TA) from the first major surface 11a toward the second major surface 11b, and the infrared spectral transmittance (TB) from the second major surface 11b toward the first major surface 11a. FIG. 6B shows the infrared spectral transmittance of the electrode layer formed by applying the electrode material (Pd) in paste form.

In both graphs, the horizontal axis is wave number (reciprocal of wavelength: $cm^{-1}$), and the vertical axis is the transmittance.

The transmittances are the results obtained by preparing samples of the electrode layer, measuring the infrared spectral transmittance, and converting the results to 1 mm thickness.

As shown in FIG. 6A, the transmittance exceeded 1% for wave numbers of not less than 1500 cm$^{-1}$ in the electrode layer 12 used in the electrostatic chuck 110 according to this embodiment, and exceeded 7% for wave numbers up to about 5000 cm$^{-1}$.

On the other hand, as shown in FIG. 6B, for an electrode layer formed by application in paste form, the transmittance does not exceed 2% at almost all wave numbers.

In this way, in the electrode layer 12 used in the electrostatic chuck 110 according to this embodiment, the infrared spectral transmittance in the infrared region (wave number of not less than approximately 2000 cm$^{-1}$ and not more than approximately 4000 cm$^{-1}$) is not less than 7%.

Figure 7:
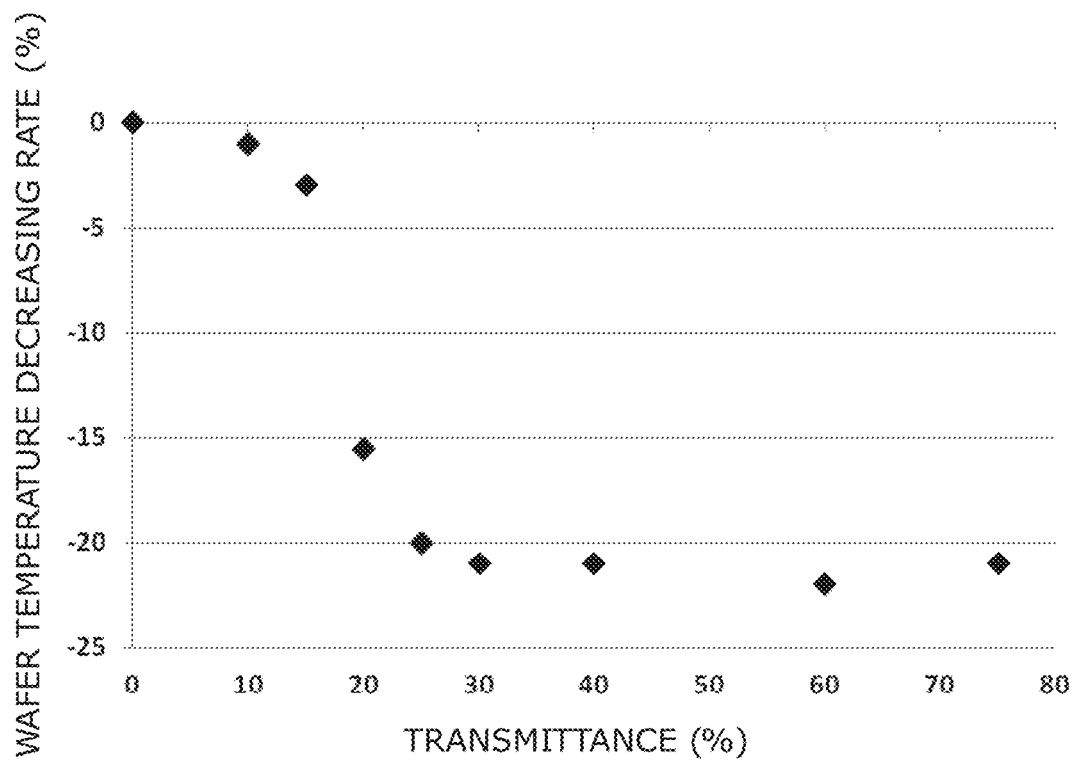
FIG. 7 shows the temperature reduction rate of a wafer.

FIG. 7 shows the temperature reduction rate of a wafer.

The horizontal axis of FIG. 7 is the transmittance of infrared light of the first dielectric layer 111 of the ceramic dielectric substrate 11, and the vertical axis is the temperature decreasing rate of a silicon wafer. The thickness of the ceramic dielectric substrate 11 is 1 mm. FIG. 7 shows the relationship between the transmittance of infrared light of the first dielectric layer 111 of the ceramic dielectric substrate 11 and the temperature decreasing rate of a silicon wafer mounted on the ceramic dielectric substrate 11.

As shown in FIG. 7, if the transmittance of infrared light of the first dielectric layer 111 is not less than 20%, it is possible to reduce the wafer temperature by approximately 15%. More preferably, if the transmittance of infrared light of the first dielectric layer 111 is not less than 25%, it is possible to reduce the wafer temperature by approximately 20%.

If $Y_2O_3$ or YAG is used as the material of the ceramic dielectric substrate 11, the transmittance of infrared light in terms of a thickness of 1 mm is not less than approximately 20% and not more than approximately 90%. In the ceramic dielectric substrate 11 made from $Y_2O_3$ or YAG, it is possible to reduce the wafer temperature by not less than 15%.

If $Al_2O_3$ is used as the material of the ceramic dielectric substrate 11, the transmittance of infrared light in terms of a thickness of 1 mm is not less than approximately 20% and not more than 90%. More preferably, if $Al_2O_3$ is used as the material of the ceramic dielectric substrate 11, the transmittance of infrared light in terms of a thickness of 1 mm is greater than 30% and not more than 90%. According to the knowledge obtained by the inventors, if $Al_2O_3$ is used as the material of the ceramic dielectric substrate 11, it is possible to fabricate the ceramic dielectric substrate 11 with the transmittance of infrared light in terms of a thickness of 1 mm of greater than 30% and not more than 90%.

Next, the relationship between foreign matter and the rise in wafer temperature is described.

Table 1 shows the relationship between the external diameter of foreign matter and the rise in wafer temperature.

TABLE 1

| | External diameter of foreign matter (mm) | | | | | | | | |
|---|---|---|---|---|---|---|---|---|---|
| | 0.5 | 1.0 | 1.5 | 2.0 | 2.5 | 3.0 | 3.5 | 4.0 | 4.5 |
| Temperature rise (° C.) | 0.1 | 0.5 | 1.1 | 1.8 | 2.8 | 3.8 | 5.1 | 6.5 | 8.1 |
| Judgment | ○ | ○ | ○ | ○ | ○ | ○ | X | X | X |

In Table 1, the external diameter of the foreign matter is the external diameter (mm) of foreign matter included in the first dielectric layer 111 of the ceramic dielectric substrate 11, and the temperature rise is the temperature rise (° C.) of the wafer. In other words, Table 1 shows how the temperature of the object to be processed W which is a wafer mounted on the first dielectric layer 111 rises depending on the size of the foreign matter included in the first dielectric layer 111. The temperature of the wafer is measured over a range of 50 mm diameter. Here, the judgment is indicated as the symbol ○ if the wafer temperature rise is not more than 5° C., and the symbol x if the temperature rise exceeds 5° C.

As shown in Table 1, if the external diameter of the foreign matter is not more than 3 mm, it is possible to suppress the temperature rise of the wafer to not more than 5° C. Alternatively, taking into consideration that foreign matter with an external diameter of not less than 0.05 mm can be seen with a stereoscopic microscope, if the external diameter of the foreign matter is not less than 0.05 mm and not more than 3 mm, it is possible to suppress the temperature rise of the wafer to not more than 5° C.

Next, the relationship between the area ratio of the foreign matter and the temperature rise of the wafer is described.

Table 2 shows the relationship between the area ratio of the foreign matter and the rise in temperature of the wafer.

TABLE 2

| | Foreign matter ratio (%) | | | | | |
|---|---|---|---|---|---|---|
| | 0.01 | 0.04 | 0.10 | 0.16 | 0.23 | 0.28 |
| Temperature rise (° C.) | 0.22 | 1.39 | 3.26 | 4.81 | 6.45 | 7.95 |

In Table 2, the foreign matter ratio is the area ratio (%) of the foreign matter relative to the area of the ceramic dielectric substrate 11 as seen in Z direction, and ΔT is the temperature rise (° C.) of the wafer.

As shown in Table 2, when the foreign matter ratio is not more than 0.16%, it is possible to suppress the temperature rise of the wafer to not more than 5° C. Alternatively, if it is assumed that the external diameter of the foreign matter is not less than 0.1 mm, if the foreign matter ratio is not less than 0.002% and not more than 0.16%, it is possible to suppress the temperature rise of the wafer to not more than 5° C.

Next, warping of the sintered body is described.

A sintered body was disposed with any face (for example, the first major surface 11a or the second major surface 11b) as the top face (measurement face) with the sintered body supported at three points. Arbitrary three positions on the measurement face were measured with an electrical micrometer, and the flatness of the flat face formed by these three positions was set to zero. Next, the maximum measurement value of the electrical micrometer and the minimum measurement value of the electrical micrometer on the measurement face were measured, and their difference was calculated as the flatness. Warping of the sintered body was evaluated based on this flatness.

An example of the results is as follows. Namely, when the thickness of the sintered body was 1 mm, the flatness was approximately 2000 μm. When the thickness of the sintered body was 3.5 mm, the flatness was approximately 700 μm. When the thickness of the sintered body was 5 mm, the flatness was approximately 300 μm. From this, it can be seen that when the thickness of the sintered body is relatively thick, the warping of the sintered body is relatively small.

The thickness of the electrostatic chuck substrate 100 is, for example, from approximately 0.5 mm to 10 mm. Preferably, the thickness of the electrostatic chuck substrate 100 is from approximately 0.5 mm to 7 mm. More preferably, the thickness of the electrostatic chuck substrate 100 is from approximately 0.5 mm to 5 mm.

According to this embodiment, it is possible to provide an electrostatic chuck capable of maintaining at the desired temperature an object to be processed that is adhered and held.

The embodiment of the invention has been described above. However, the invention is not limited to the above description. Those skilled in the art can suitably modify the above embodiment, and such modifications are also encompassed within the scope of the invention as long as they include the features of the invention.

Furthermore, various components in the above embodiment can be combined with each other as long as technically feasible. Such combinations are also encompassed within the scope of the invention as long as they include the features of the invention.

What is claimed is:

1. An electrostatic chuck, comprising: a ceramic dielectric substrate having a first major surface on which an object to be processed is mounted, and a second major surface on a side opposite the first major surface, the ceramic dielectric substrate being a polycrystalline ceramic sintered body; and
   an electrode layer interposed between the first major surface and the second major surface of the ceramic dielectric substrate, the electrode layer being integrally sintered with the ceramic dielectric substrate,
   the ceramic dielectric substrate including a first dielectric layer between the electrode layer and the first major surface, and a second dielectric layer between the electrode layer and the second major surface,
   at least the first dielectric layer of the ceramic dielectric substrate having an infrared spectral transmittance in terms of a thickness of 1 mm of not less than 20%, and
   wherein the electrode layer includes a first portion having conductivity, and a second portion having infrared spectral transmittance greater than the first portion.

2. The electrostatic chuck according to claim 1, wherein the thickness of the first dielectric layer is not less than 100 micrometers.

3. The electrostatic chuck according to claim 2, wherein crystal grains included in the ceramic dielectric substrate are bonded together by a solid phase sintering or a liquid phase sintering.

4. The electrostatic chuck according to claim 3, wherein the purity of the ceramic dielectric substrate is not less than 99.9% by weight.

5. The electrostatic chuck according to claim 1, wherein the first portion is directly bonded to the second portion.

6. The electrostatic chuck according to claim 1, wherein the second portion mechanically bonds the first dielectric layer and the second dielectric layer, and
   the second portion optically connects between the first dielectric layer and the second dielectric layer so that infrared light passes through the electrode layer.

7. The electrostatic chuck according to claim 6, wherein the second portion includes a portion that extends in a direction not parallel to the first major surface.

8. The electrostatic chuck according to claim 1, wherein the mean grain size of crystals included in the ceramic dielectric substrate is greater than the mean grain size of crystals included in the second portion.

9. The electrostatic chuck according to claim 1, wherein the material of the second portion is the same as the material of the ceramic dielectric substrate.

10. The electrostatic chuck according to claim 1, wherein the material of the crystals included in the ceramic dielectric substrate is any of $Al_2O_3$, $Y_2O_3$, and YAG.

11. The electrostatic chuck according to claim 1, wherein the first portion is electrically conductive.

12. An electrostatic chuck, comprising:
    a ceramic dielectric substrate having a first major surface on which an object to be processed is mounted, and a second major surface on a side opposite the first major surface, the ceramic dielectric substrate being a polycrystalline ceramic sintered body; and
    an electrode layer interposed between the first major surface and the second major surface of the ceramic dielectric substrate, the electrode layer being integrally sintered with the ceramic dielectric substrate,
    the ceramic dielectric substrate including a first dielectric layer between the electrode layer and the first major surface, and a second dielectric layer between the electrode layer and the second major surface,
    at least the first dielectric layer of the ceramic dielectric substrate having an infrared spectral transmittance in terms of a thickness of 1 mm of not less than 20%,
    wherein the thickness of the first dielectric layer is not less than 100 micrometers, and
    wherein the external diameter of foreign matter included in the first dielectric layer is not more than 3 mm.

13. The electrostatic chuck according to claim 12, wherein the external diameter of the foreign matter is not more than 2 mm.

14. An electrostatic chuck, comprising:
    a ceramic dielectric substrate having a first major surface on which an object to be processed is mounted, and a second major surface on a side opposite the first major surface, the ceramic dielectric substrate being a polycrystalline ceramic sintered body; and
    an electrode layer interposed between the first major surface and the second major surface of the ceramic dielectric substrate, the electrode layer being integrally sintered with the ceramic dielectric substrate,
    the ceramic dielectric substrate including a first dielectric layer between the electrode layer and the first major surface, and a second dielectric layer between the electrode layer and the second major surface,
    at least the first dielectric layer of the ceramic dielectric substrate having an infrared spectral transmittance in terms of a thickness of 1 mm of not less than 20%,
    wherein the thickness of the first dielectric layer is not less than 100 micrometers, and
    wherein an occupancy ratio of foreign matter included in the first dielectric layer per unit area is not more than 0.16 area percent.

* * * * *